United States Patent [19]

Blieden et al.

[11] 4,135,537
[45] Jan. 23, 1979

[54] LIGHT COLLECTOR

[75] Inventors: Harry R. Blieden, Los Angeles, Calif.; Roderick W. MacDonald, Richardson, Tex.

[73] Assignee: Atlantic Richfield Company, Los Angeles, Calif.

[21] Appl. No.: 888,093

[22] Filed: Mar. 20, 1978

[51] Int. Cl.² .......................................... H01L 31/04
[52] U.S. Cl. ...................... 136/89 PC; 136/89 HY; 250/573
[58] Field of Search ................ 136/89 PC, 89 HY; 250/573, 238

[56] References Cited

U.S. PATENT DOCUMENTS

| 4,002,031 | 1/1977 | Bell | 60/641 |
| 4,056,405 | 11/1977 | Varadi | 136/89 PC |

FOREIGN PATENT DOCUMENTS 2501907 7/1976 Fed. Rep. of Germany ...... 136/89 PC

OTHER PUBLICATIONS

P. B. Mauer et al., "Fluorescent Concentrator for Solar Energy Collection", Research Disclosure, Jan. 1976, p. 20.

*Primary Examiner*—John H. Mack
*Assistant Examiner*—Aaron Weisstuch
*Attorney, Agent, or Firm*—Roderick W. MacDonald

[57] ABSTRACT

A method and apparatus for recovering energy from light, such as sunlight, wherein a luminescent fluid is employed in conjunction with photovoltaic means, heat is recovered from the luminescent fluid, and electricity is recovered from the photovoltaic means.

13 Claims, 5 Drawing Figures

LIGHT COLLECTOR

BACKGROUND OF THE INVENTION

It is well known that photovoltaic cells use specially prepared semiconductor junctions to convert energy from sunlight to electricity.

It is also known that a specific photovoltaic semiconductor junction utilizes, for conversion to electricity, only a portion of the spectrum of energy available in the available light. For example, the conversion of sunlight to electrical energy using well known silicon photovoltaic cells is strongly dependent upon the conversion of light with energy at or above 1.1 electron volts while the lower energy light also present is, at least in part, converted to heat instead of electricity. The heat generated can reduce the efficiency of the silicon cell for the conversion of the higher energy light to electricity.

Some of the sunlight which penetrates the solid light transmitting member of a conventional photovoltaic array is lost such as by passing through an interstice between adjacent photovoltaic cells, reflection back out of the member, absorption, and the like.

Accordingly, current photovoltaic arrays receive more energy input from incident light than they retain for conversion into electrical output, and it is highly desirable to increase the amount of light an array retains for such conversion.

One known approach for increasing the capacity of photovoltaic arrays to convert light energy to electricity is to employ one or more solid luminescent agents in the solid light transmitting member. Such agents, when exposed to sunlight, take in light from one direction and emit lower energy light in numerous directions. Examples of such agents are organic dyes such as the dyes heretofore employed in scintillation counters, lasers, and the like.

The particular luminescent agent or agents employed in conjunction with an array of specific photovoltaic cells are chosen, inter alia, for their ability to emit light in an energy level range which suits the conversion characteristics of that cell. This way, a portion of the light that would otherwise be lost for electrical generation by transmission, reflection, and the like is transformed by the luminescent agent into multi-directional light that is more readily retained in the light transmitting member and which the photovoltaic cell or cells can readily convert into electricity, thereby increasing the overall efficiency of the array.

A photovoltaic array which employs this approach is referred to as a luminescent photovoltaic array. Such an array usually employs fluorescent dyes, fluorescence being that species of luminescence wherein the emitted light is usually in the visible spectrum. However, other species of luminescence exist. Phosphoresence (light emission continues after the stimulating light has stopped) is one such species.

It should be understood that this invention covers all species of luminescence, as well as all types of luminescent agents.

Heretofore the prior art has required the photovoltaic cell or cells employed to be mounted on the thin edge of a solid, plastic or glass, light transmitting luminescent member. Such a device is fully and completely disclosed in Applied Optics, Volume 15, No. 10, Pages 2299 and 2300, October, 1976, the disclosure of which is incorporated herein by reference.

SUMMARY OF THE INVENTION

According to this invention there is provided a light collector apparatus and method wherein a luminescing fluid (gas and/or liquid) is employed and the heat generated upon exposure to light, direct or indirect, is recovered from the fluid thereby providing better recovery of energy from the incident light since both heat energy and electrical energy are recovered.

Accordingly, it is an object of this invention to provide a new and improved luminescent photovoltaic device.

Other aspects, objects and advantages of this invention will be apparent to those skilled in the art from this disclosure and the appended claims.

DETAILED DESCRIPTION OF THE INVENTION

Figure 1:
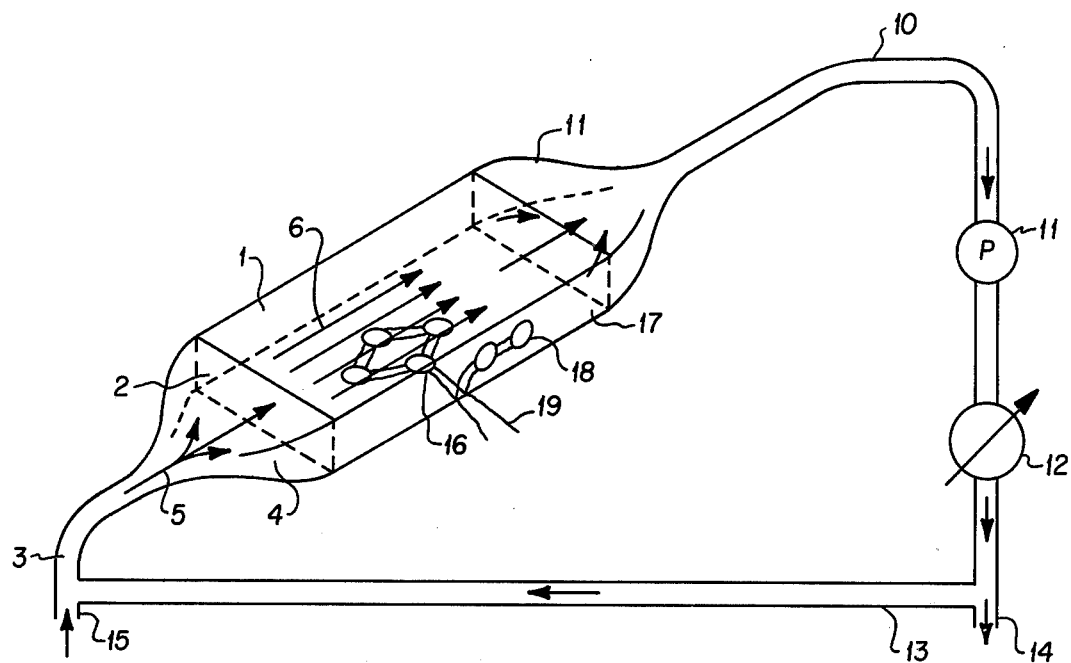
FIG. 1 shows one embodiment within this invention.

More specifically, FIG. 1 shows apparatus within this invention comprising a hollow collector chamber 1 whose outer walls are made of a light transmitting material such as plastic, glass, and the like so that either direct or indirect sunlight rays can pass through these walls into the hollow interior of chamber 1. An inlet conduit means 3 which includes a manifold means 4 is provided for passing a luminescent fluid into hollow interior 2 as shown by arrows 5. Luminescent fluid spreads out to fill the entire hollow interior 2 as shown by arrows 6.

Luminescent fluid passes through interior 2 and exits from chamber 1 through outlet conduit means 10, means 10 including exit manifold means 11.

Outlet conduit means 10 channels the heated luminescent fluid from chamber 1 through pump means 11 into heat exchange means 12 wherein heat is extracted from the luminescent fluid. The cooled luminescent fluid from heat exchanger 12 then passes by way of recycle conduit means 13 back to inlet conduit means 3 for passage through chamber 1.

The system of FIG. 1 can be a closed system with total recycle from conduit 10 through conduit 13 into conduit 3 or it can be open system with all or part of the luminescent fluid removed by way of conduit means 14 with makeup luminescent fluid being supplied by way of conduit 15.

Chamber 1 carries on the bottom side thereof a plurality of photovoltaic cells 16 and on upstanding side 17 additional photovoltaic cells 18, if desired, all cells being wired together with one or more wires 19 extending therefrom by which electricity is recovered from the apparatus.

Accordingly, light such as sunlight reaching interior 2 of chamber 1 is essentially either coverted into electricity by way of photovoltaic cells 16 and 18 or converted into heat in the luminescent fluid in interior 2. Such heat is essentially recovered by way of heat exchanger 12 for space heating, heating a heat reservoir, and the like.

Figure 2:
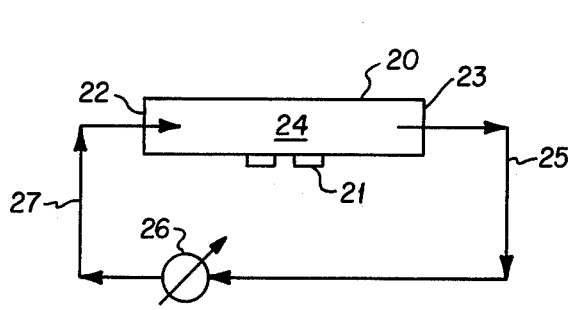
FIG. 2 shows a cross-section of another cross-section of a modified embodiment of FIG. 1.

FIG. 2 shows another hollow chamber 20 carrying a plurality of photovoltaic cells 21 on the bottom side thereof which chamber, like chamber 1, has open ends 22 and 23 so that luminescent fluid can be passed through hollow interior 24 of that chamber. This embodiment shows a closed system which relies on gravity cycling so that external to chamber 20 in the system is outlet conduit means 25, heat exchange means 26 for recovering heat from the luminescent fluid which has been removed from interior 24 by way of conduit means 25, and a recycle (inlet) conduit means 27 for returning cool luminescent fluid to interior 24 to be heated again.

Figure 3:
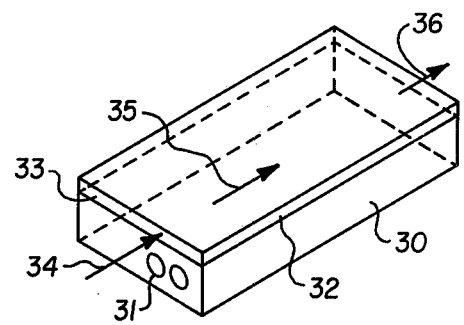
FIG. 3 shows yet another embodiment within this invention.

FIG. 3 shows a closed chamber 30. Chamber 30 is unlike chamber 20 in FIG. 2 in that there are no open ends for circulation of luminescent fluid. Chamber 30 contains luminescent fluid trapped therein and has photovoltaic cells 31 on one end thereof. Superimposed on the upper surface of chamber 30 in heat exchange relationship with chamber 30 is a hollow cooling channel 32 which is adapted to receive cooling fluid through one open end 33 thereof as shown by arrow 34. This way cooling fluid passes through the hollow interior of channel 32 as shown by arrow 35, picks up heat from chamber 30 and thereby cools the luminescent fluid trapped in that chamber. The heated cooling fluid passes out of channel 32 through the opposing open end thereof as shown by arrow 36 and is passed through a heat exchanger (not shown) for recovery of the heat energy. In this embodiment the luminescent fluid remains stationary while a separate cooling fluid such as air, water, glycols, and the like, circulates through cooling channel 32. Note that channel 32 is co-extensive with the upper face of chamber 30. This is not required; the channel can be narrower in width and/or shorter than the face of chamber 30 with which it is in exchange contact.

Figure 4:
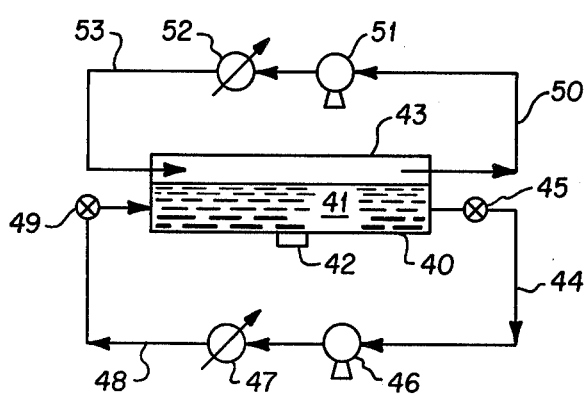
FIG. 4 shows a modification of the embodiment of FIG. 3.

FIG. 4 shows closed chamber 40 carrying luminescent fluid 41 therein and photovoltaic means 42 on the bottom side thereof. A cooling channel 43 is carried on the upper surface of chamber 40 in heat exchange contact with chamber 40 as described in FIG. 3. Chamber 40 is modified from chamber 30 of FIG. 3 in that outlet conduit means carrying valve 45 is connected to the chamber. Conduit 44 passes through pump means 46 and heat exchanger 47. The outlet of heat exchanger 47 passes into recycle conduit means 48, which carries valve 49, for passage back into the hollow interior of chamber 40. Cooling chamber 43 has connected thereto outlet conduit means 50 which passes through pump means 51 and into heat exchange means 52. The outlet of heat exchanger 52 passes into recycle conduit means 53 for return to the interior of cooling channel 43 to pick up additional heat from the luminescent fluid in chamber 40. By this embodiment valves 45 and 49 can be closed to trap luminescent fluid therein, in which case heat will be recovered therefrom by way of the cooling fluid passing through heat exchanger 52. In addition, if desired, valves 45 and 49 can be partially or completely open to allow for circulation of luminescent fluid through heat exchanger 47 thereby recovering yet additional heat by way of heat exchanger 47.

Figure 5:
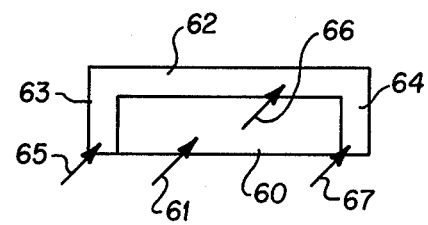
FIG. 5 shows yet another modification of the embodiment of FIG. 3.

FIG. 5 shows a hollow chamber 60 adapted to carry luminescent fluid therein as shown by arrow 61. Chamber 60 has a cooling channel coextensive with three sides thereof as shown by side 62 and legs 63 and 64 thereby providing a cooling channel which is coextensive with a plurality of sides of chamber 60. This allows cooling fluid to come in heat exchange contact with three sides of chamber 60 as shown by arrows 65, 66 and 67.

The luminescent fluid employed in this invention can be either liquid or gaseous or combinations of both as desired. For example, known organic luminescent dyes can be dissolved in a suitable solvent and used in the liquid and/or gaseous form in this invention. There are a large number of dyes known in the prior art. For example, coumarin 102, (2,3,5,6-1H,4H-tetrahydro-8-methylquinolazino-[9,9a,1-gh] coumarin, when dissolved in an acidic solution fluoresces yellow in a broad band which gives rise to a broad tuning range depending upon the liquid associated therewith, e.g., ethanol, methanol, n-methyl-2-pyrrolidinone, hexafluoroisopropanol, and the like. The materials and their solvents are well known in the art and therefore further description is not necessary to inform the art. The particular solvent employed and the amount of dye or dyes or other luminescent agents dissolved in the solvent will vary widely depending upon the particular materials employed, the combinations of those materials, and the functional requirements of the particular apparatus in question and, therefore, further quantification of the luminescent fluid is not only impossible without unduly restricting the invention but not necessary to inform one skilled in the art.

EXAMPLE

Apparatus such as that shown in FIG. 1 without conduits 14 and 15 is employed using a solution of coumarin 102 in ethanol, solution containing about $5 \times 10^{-4}$ weight percent coumarin 102 based on the total weight of the solution. The hollow chamber is made of polymethylmethacrylate and the large surface area sides of the chamber are about 10 inches by 10 inches and carry about 10 commercially available 3 inch round silicon p-n photovoltaic cells glued thereto by silicone. The luminescent solution is pumped through the chamber and from the chamber through a conventional heat exchanger to generate hot air which is then used for space heating purposes. The electricity is recovered from the photovoltaic cells for use elsewhere.

Reasonable variations and modifications are possible within the scope of this disclosure without departing from the spirit and scope of this invention.

The embodiments of the invention in which an exclusive property or privilege is claimed are defined as follows:

1. A light collector comprising a hollow collector chamber adapted to transmit light from outside said chamber into its hollow interior, inlet conduit means for passing luminescent fluid into the hollow interior of said chamber, outlet conduit means for removing luminescent fluid from the hollow interior of said chamber, heat exchange means for removing heat from the luminescent fluid in said outlet conduit means, photovoltaic means carried by said chamber for generating electricity, and said chamber carries in heat exchange relationship therewith a separate hollow cooling channel adapted to have a separate cooling fluid passed therethrough to cool said chamber.

2. A device according to claim 1 wherein there is recycle conduit means for returning cooled luminescent fluid from said heat exchange means to said inlet conduit means.

3. A device according to claim 2 wherein there is pump means for cycling luminescent fluid from said outlet conduit means through said heat exchange means and recycle conduit means.

4. A device according to claim 1 wherein said cooling channel is coextensive with one side of said chamber.

5. A device according to claim 1 wherein said cooling channel is coextensive with a plurality of sides of said chamber.

6. A solar collection method comprising exposing a hollow light transmitting chamber which carries photovoltaic means to sunlight, passing a gaseous luminescent fluid through said chamber, recovering heat from said fluid after it passes through said chamber, and recovering electricity from said photovoltaic means.

7. The method according to claim 6 including passing a heat exchange fluid in heat exchange contact with said chamber.

8. A solar collector comprising a closed hollow chamber adapted to transmit light from outside said chamber into its hollow interior, a luminescent fluid in the closed interior of said chamber, a hollow cooling channel in heat exchange contact with said chamber, means for passing a cooling fluid through said channel, means for recovering heat from said cooling fluid, and photovoltaic means on said chamber.

9. A device according to claim 8 wherein said cooling channel is coextensive with one side of said chamber.

10. A device according to claim 8 wherein said cooling channel is coextensive with a plurality of sides of said chamber.

11. A light collecting method comprising exposing a closed hollow light transmitting chamber which carries photovoltaic means thereon and a luminescent fluid therein to light, passing a separate cooling fluid in heat exchange contact with said chamber to cool same, recovering heat from said cooling fluid, and recovering electricity from said photovoltaic means.

12. A method according to claim 11 wherein said luminescent fluid is liquid, gaseous, or a combination thereof.

13. A method according to claim 11 wherein said luminescent fluid is a liquid which contains at least one organic dye luminescent agent dissolved in a liquid solvent for said dye.

* * * * *